United States Patent
Shon et al.

(10) Patent No.: US 10,587,265 B2
(45) Date of Patent: Mar. 10, 2020

(54) SEMICONDUCTOR DEVICE AND SEMICONDUCTOR SYSTEM

(71) Applicant: SAMSUNG ELECTRONICS CO., LTD., Suwon-si (KR)

(72) Inventors: Yoo Seok Shon, Seoul (KR); Sang Woo Kim, Suwon-si (KR); Byung Tak Lee, Jeju-si (KR); Yun Ju Kwon, Yongin-si (KR); Joon-Woo Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/107,424

(22) Filed: Aug. 21, 2018

(65) Prior Publication Data

US 2019/0214989 A1    Jul. 11, 2019

(30) Foreign Application Priority Data

Jan. 8, 2018    (KR) .................. 10-2018-0002206

(51) Int. Cl.
   *G06F 1/32*    (2019.01)
   *H03K 19/00*   (2006.01)
   *G06F 1/06*    (2006.01)
   *G06F 1/3234*  (2019.01)
   *G06F 1/3287*  (2019.01)

(52) U.S. Cl.
   CPC ........... *H03K 19/0016* (2013.01); *G06F 1/06* (2013.01); *G06F 1/3275* (2013.01); *G06F 1/3287* (2013.01)

(58) Field of Classification Search
   None
   See application file for complete search history.

(56) References Cited

U.S. PATENT DOCUMENTS

| | | |
|---|---|---|
| 7,619,440 B2 | 11/2009 | Amedo et al. |
| 8,633,751 B2 | 1/2014 | Hegde |
| 9,081,577 B2 | 7/2015 | Conrad et al. |
| 9,104,421 B2 | 8/2015 | Ahmad et al. |
| 9,166,567 B2 | 10/2015 | Park et al. |
| 9,270,270 B2 | 2/2016 | Cai et al. |
| 9,411,404 B2 | 8/2016 | Kumar et al. |
| 9,542,994 B1 | 1/2017 | Prabhat et al. |
| 2012/0102344 A1* | 4/2012 | Kocev .................. G06F 1/3237 713/322 |
| 2014/0095896 A1 | 4/2014 | Carter et al. |

(Continued)

*Primary Examiner* — Danny Chan
(74) *Attorney, Agent, or Firm* — Sughrue Mion, PLLC

(57) ABSTRACT

Provided are a semiconductor device and a semiconductor system. A semiconductor device includes a hardware auto clock gating (HWACG) logic configured to provide clock gating of an intellectual property (IP) block; and a memory power controller configured to perform power gating of a memory electrically connected with the IP block, based on the HWACG logic providing the clock gating for the IP block. The HWACG logic includes a first clock source configured to provide a first clock signal; a second clock source configured to receive the first clock signal provided by the first clock source, and provide a second clock signal to the IP block; a first clock control circuit configured to control the first clock source; and a second clock control circuit configured to transmit a clock request to the first clock control circuit, and control the second clock source, based on an operation state of the IP block.

20 Claims, 10 Drawing Sheets

(56) References Cited

U.S. PATENT DOCUMENTS

| | | | |
|---|---|---|---|
| 2017/0010655 A1* | 1/2017 | Kanchana | G06F 1/3275 |
| 2017/0212551 A1* | 7/2017 | Lee | G06F 1/04 |
| 2017/0214395 A1* | 7/2017 | Kim | H03K 3/012 |
| 2017/0220100 A1* | 8/2017 | DiBene, II | G06F 1/324 |

* cited by examiner

US 10,587,265 B2

SEMICONDUCTOR DEVICE AND SEMICONDUCTOR SYSTEM

This application is based on and claims priority under 35 U.S.C. § 119 to Korean Patent Application No. 10-2018-00002206 filed on Jan. 8, 2018 in the Korean Intellectual Property Office, the disclosure of which is incorporated by reference herein in its entirety.

BACKGROUND

1. Field

Example embodiments present disclosure relates to a semiconductor device and a semiconductor system.

2. Description of the Related Art

A system-on-chip (SoC) may include at least one intellectual property (IP) block, a clock management unit (CMU), and a power management unit (PMU). The CMU provides a clock signal to at least one IP block, whereas the CMU stops the provision of the clock signal to the IP block that is not running, thereby reducing unnecessary resource waste in a system employing the SoC.

In order to control the provision of the clock signal, a clock gating technology is used. In order to implement clock gating, various clock sources, such as a multiplexing circuit (MUX circuit), a clock dividing circuit, a short stop circuit, and a clock gating circuit, included in the CMU, may be controlled by software using a special function register (SFR). However, generally, the control speed of the clock sources by software may be slower than the control speed of the clock sources by hardware, and the performance of the clock sources by software may be lower than the performance of the clock sources by hardware. Therefore, it is required to perform clock gating in a precise manner according to the operation environment of SoC by controlling various clock sources of the CMU in hardware.

Moreover, in order to reduce power consumption, a power gating technology may be used for various devices (for example, memory) that are electrically connected to the IP block and operable together. Similar to the clock gating technology, the power gating technology is also required to be processed by hardware.

SUMMARY

One or more example embodiments provide a semiconductor device which can also implement power gating by hardware in a system in which clock gating by hardware is implemented.

One or more example embodiments also provide a semiconductor system which can also implement power gating by hardware in a system in which clock gating by hardware is implemented.

According to an example embodiment of the present disclosure, there is provided a semiconductor device including a hardware auto clock gating (HWACG) logic configured to provide clock gating of an intellectual property (IP) block; and a memory power controller configured to perform power gating of a memory electrically connected with the IP block, based on the HWACG logic providing the clock gating for the IP block. In some embodiments, the HWACG logic includes a first clock source configured to provide a first clock signal; a second clock source configured to receive the first clock signal provided by the first clock source, and provide a second clock signal to the IP block; a first clock control circuit configured to control the first clock source; and a second clock control circuit configured to transmit a clock request to the first clock control circuit, and control the second clock source, based on an operation state of the IP block.

According to another example embodiment of the present disclosure, there is provided a semiconductor device, including a HWACG logic configured to provide clock gating of an IP block; and device power controller configured to perform power gating of a device electrically connected with the IP block based on the HWACG logic providing the clock gating of the IP block. In some embodiments, the HWACG logic includes a first clock source configured to provide a first clock signal; a second clock source configured to receive the first clock signal provided by the first clock source, and provide a second clock signal to the IP block; a first clock control circuit configured to control the first clock source; and a second clock control circuit configured to transmit a clock request to the first clock control circuit, and control the second clock source, based on an operation state of the IP block.

According to still another example embodiment of the present disclosure, there is provided a semiconductor system, including a system-on-chip (SoC) including: an IP block, and a clock management unit (CMU) configured to provide a clock signal to the IP block; and at least one external device electrically connected with the SoC. In some embodiments, the CMU includes a HWACG logic configured to provide clock gating of the IP block, and a memory power controller configured to perform power gating of a memory electrically connected with the IP block, based on the HWACG logic providing the clock gating for the IP block. In some embodiments the HWACG logic includes: a first clock source configured to provide a first clock signal; a second clock source configured to receive the first clock signal provided by the first clock source, and provide a second clock signal to the IP block; a first clock control circuit configured to control the first clock source; and a second clock control circuit configured to transmit a clock request to the first clock control circuit and control the second clock source based on an operation state of the IP block.

BRIEF DESCRIPTION OF THE DRAWINGS

The above and other aspects and features will become more apparent by describing in detail example embodiments with reference to the attached drawings, in which.

DETAILED DESCRIPTION

Hereinafter, example embodiments will be described with reference to the attached drawings. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
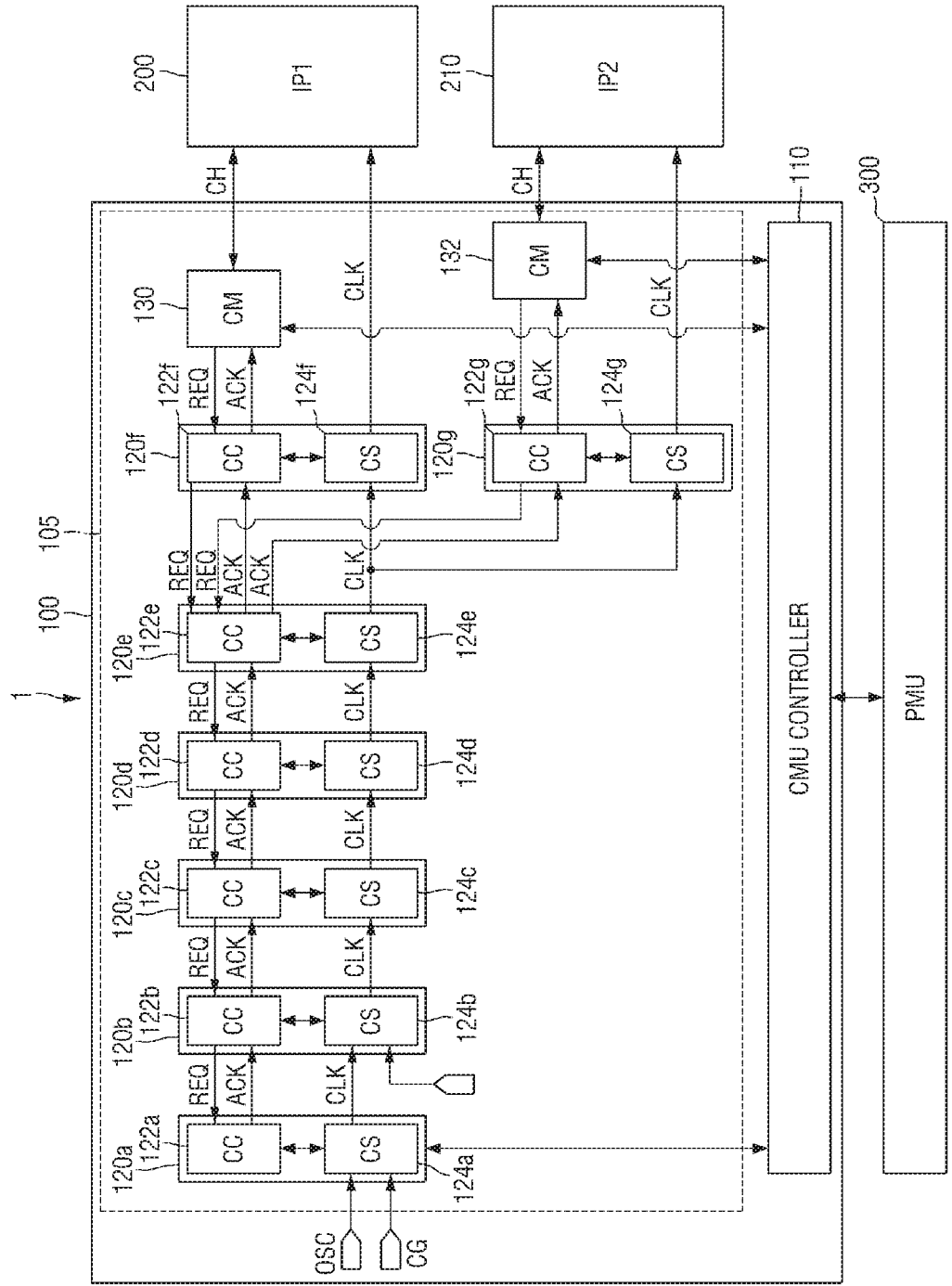
FIG. 1 is a block diagram illustrating a semiconductor device according to an example embodiment.

FIG. 1 is a block diagram illustrating a semiconductor device according to an example embodiment.

Referring to FIG. 1, a semiconductor device 1 according to an embodiment includes a clock management unit (CMU) 100, one or more intellectual property (IP) blocks 200 and 210, and a power management unit (PMU) 300. The semiconductor device 1 according to various example embodiments may be implemented by a system-on-chip (SoC), but embodiments not limited thereto.

The clock management unit 100 provides clock signals to the IP blocks 200 and 210. In this embodiment, the clock management unit 100 includes clock components 120a, 120b, 120c, 120d, 120e, 120f, and 120g, channel management circuits (CMs) 130 and 132, and a clock management unit controller 110 (CMU Controller) 110. The clock components 120a, 120b, 120c, 120d, 120e, 120f, and 120g generate clock signals to be provided to the IP blocks 200 and 210, and the channel management circuits 130 and 132 are disposed between the clock components 120f and 120g and the IP blocks 200 and 210 to provide communication channels (CHs) between the clock management unit 100 and the IP blocks 200 and 210. The clock management unit controller 110 provides clock signals to the IP blocks 200 and 210 using the clock components 120a, 120b, 120c, 120d, 120e, 120f and 120g.

The clock management unit controller 110 may perform clock gating of the IP blocks 200 and 210 using the clock components 120a, 120b, 120c, 120d, 120e, 120f and 120g and the channel management circuits 130 and 132. Considering that the clock gating is performed under the control of hardware as will be described later, the circuit including the clock components 120a, 120b, 120c, 120d, 120e, 120f, 120g and channel management circuits 130 and 132 is referred to as a hardware auto clock gating (HWACG) logic 105.

In some example embodiments, each of the communication channels CHs provided by the channel management circuits 130 and 132 may be implemented to conform to a low power interface (LPI), Q-channel interface or P-channel interface of ARM Corporation. However, embodiments are not limited thereto, and each of the communication channels CHs may be implemented as a communication channel CH conforming to an arbitrary communication protocol determined depending on a predetermined purpose.

Each of the clock components 120a, 120b, 120c, 120d, 120e, 120f, and 120g includes clock sources CS 124a, 124b, 124c, 124d, 124e, 124f, and 124g, and clock control circuits CC 122a, 122b, 122c, 122d, 122e, 122f, and 122g respectively controlling the clock sources CS 124a, 124b, 124c, 124d, 124e, 124f, and 124g. Each of the clock sources CS 124a, 124b, 124c, 124d, 124e, 124f, and 124g may include a multiplexing (MUX) circuit, a clock dividing circuit, a short stop circuit, and a clock gating circuit.

The clock components 120a, 120b, 120c, 120d, 120e, 120f, and 120g form parent-child relationships with each other. In this embodiment, the clock component 120a is a parent of clock component 120b, and the clock component 120b is a child of the clock component 120a and a parent of the clock component 120c. Further, the clock component 120e is a parent of the two clock components 120f and 120g, and the clock components 120f and 120g are children of the clock component 120e. In this embodiment, the clock component 120a located closest to a phase locked loop (PLL) is a root clock component, and the clock components 120f and 120g located closest to the IP blocks 200 and 210 are leaf clock components. Such a parent-child relationship is necessarily formed also between the clock control circuits 122a, 122b, 122c, 122d, 122e, 122f, and 122g and between the clock sources 124a, 124b, 124c, 124d, 124e, 124f, and 124g depending on the parent-child relationship between the clock components 120a, 120b, 120c, 120d, 120e, and 120f.

The clock control circuits 122a, 122b, 122c, 122d, 122e, 122f and 122g transmit and receive a clock request REQ and an acknowledgment ACK thereof between the parent and the child, and provide clock signals.

When the IP block 200 does not require a clock signal, for example, when the IP block 200 is required to be in a sleep state, the clock management unit 100 may stop the provision of clock signals to the IP clock 200.

Specifically, under the control of the clock management unit 100 or the clock management unit controller 110, the channel management circuit 130 transmits a first signal for stopping the provision of clock signals to the IP block 200. The IP block 200 having received the first signal transmits a second signal for stopping the provision of clock signals to the channel management circuit 130 after completing the work in processing. The channel management circuit 130 receives the second signal from the IP block 200 and then requests the clock component 120f corresponding to its parent to stop the provision of clock signals.

For example, if the communication channel CH provided by the channel management circuit 130 conforms to a Q-channel interface, the channel management circuit 130 may provide a QREQn signal having a first logic value (for example, logic low, hereinafter, represented by L) as a first signal to the IP block 200. Thereafter, the channel management circuit 130 receives a QACCEPTn signal having a first logic value as a second signal from the IP block 200, and then transmits a clock request REQ having a first logic value to the clock component 120f. In this case, the clock request REQ having the first logic value is referred to as "clock provision stop request".

The clock control circuit 122f having received the clock request REQ having the first logic value, that is, the clock provision stop request disables the clock source 124f (for example, clock gating circuit) to stop the provision of clock signals, and thus the IP block 200 enters a sleep mode. In this procedure, the clock control circuit 122f may provide an acknowledgement ACK having a first logic value to the channel management circuit 130. Even though the channel management circuit 130 has transmitted the clock provision stop request having the first logic value to the clock control circuit 122f and then has received the acknowledgement ACK having the first logic value from the clock control circuit 122f, it is not guaranteed that the provisioning of the clock from the clock source 124f has stopped. However, the acknowledgement ACK only has meaning that the clock control circuit 122f has recognized that the clock component 120f, which is a parent of the channel management circuit 130, does not need to provision the clock to the channel management circuit 130 anymore.

The clock control circuit 122*f* of the clock component 120*f* transmits the clock request REQ having the first logic value to the clock control circuit 122*e* of the clock component 120*e* corresponding to its parent. If the IP block 210 also does not need a clock signal, for example, if the clock control circuit 122*e* receives a clock provision stop request from the clock control circuit 122*g*, the clock control circuit 122*e* disable the clock source 124*e* (for example, clock dividing circuit) to stop the provision of the clock signal. Accordingly, the IP blocks 200 and 210 may enter a sleep mode.

This operation may be similarly performed for the other clock control circuits 122*a*, 122*b*, 122*c*, and 122*d*.

If the clock control circuit 122*f* of the clock component 120*f* transmits the clock request REQ having the first logic value to the clock control circuit 122*e* of the clock component 120*e* corresponding to its parent, but the IP block 210 is in a running state, the clock control circuit 122*e* cannot disable the clock source 124*e*. Thereafter, until the IP block 210 no longer requires a clock signal, the clock control circuit 122*e* may disable the clock source 124*e* and transmit the clock request REQ having the first logic value to the clock control circuit 122*d* corresponding to its parent. That is, the clock control circuit 122*e* may disable the clock source 124*e* only when it receives a clock provision stop request from all the clock control circuits 122*f* and 122*g* corresponding to children.

When the IP block 200 enters a running state from a sleep state with all the disabled clock sources 124*a*, 124*b*, 124*c*, 124*d*, 124*e*, and 124*f*, the clock management unit 100 resumes the provision of clock signals to the IP blocks 200 and 210.

The channel management circuit 130 transmits a clock request REQ having a second logic value (for example, logic high, hereinafter, represented by H) to the clock control circuit 122*f* of the clock component 120*f* corresponding to its parent, and waits for an acknowledgement ACK from the clock control unit 122*f*. Here, the clock request REQ having a second logic value is referred to as a "clock provision request," and the acknowledgement ACK for the clock provision request means that the provisioning of the clock resumes from the clock source 124*f*. The clock control circuit 122*f* cannot directly enable the clock source 124*f* (for example, clock gating circuit), and wait for the provision of clock signals from the parent.

Next, the clock control circuit 122*f* transmits a clock request REQ having a second logic value. That is, a clock provision request is transmitted to the clock control circuit 122*e* corresponding to its parent, and the clock control circuit 122*f* waits for an acknowledgement ACK from the clock control circuit 122*e*. This operation may be similarly performed for the clock control circuits 122*a*, 122*b*, 122*c*, and 122*d*.

The clock control circuit 122*a* is a root clock component having received a clock request REQ having a second logic value from the clock control circuit 122*b*. The clock control circuit 122*a* enables the clock source 124*a* (for example, a multiplexing circuit) and transmits an acknowledgement ACK to the clock control circuit 122*b*. Once the clock sources 124*b*, 124*c*, 124*d*, 124*d* and 124*e* are sequentially enabled in this manner, the clock control circuit 122*e* transmits an acknowledgement ACK, providing a notification that provisioning of the clock has resumed from the clock source 124*e*, to the clock control circuit 122*f*. The clock control circuit 122*f* having received the acknowledgement ACK enables the clock source 124*f* to provide a clock signal to the IP block 200 and to provide the acknowledgement ACK to the channel management circuit 130.

The clock control circuits 122*a*, 122*b*, 122*c*, 122*d*, 122*e*, 122*f* and 122*g* operate in a full handshake mode in which clock requests REQs and acknowledgements ACKs are transmitted and received between parents and children. The handshake mode refers to the message sequence of a REQ message followed by an ACK message. The clock control circuits 122*a*, 122*b*, 122*c*, 122*d*, 122*e*, 122*f* and 122*g* control the clock sources 124*a*, 124*b*, 124*c*, 124*d*, 124*e*, 124*f* and 124*g* in hardware. Thus the clock control circuits control the clock signals provided to the IP blocks 200 and 210. This control includes clock gating of one or more IP blocks 200 and 210.

These clock control circuits 122*a*, 122*b*, 122*c*, 122*d*, 122*e*, 122*f*, 122*g* may transmit clock requests REQs to parents and control the clock sources 124*a*, 124*b*, 124*c*, 124*d*, 124*e*, 124*f*, and 124*g*, and may operate under the control of the clock management unit controller 110. In some example embodiments, the clock control circuits 122*a*, 122*b*, 122*c*, 122*d*, 122*e*, 122*f*, and 122*g* may include finite state machines (FSMs) controlling the clock sources 124*a*, 124*b*, 124*c*, 124*d*, 124*e*, 124*f*, and 124*g*, respectively, in response to the clock requests REQs transmitted and received between parents and children.

Figure 2:
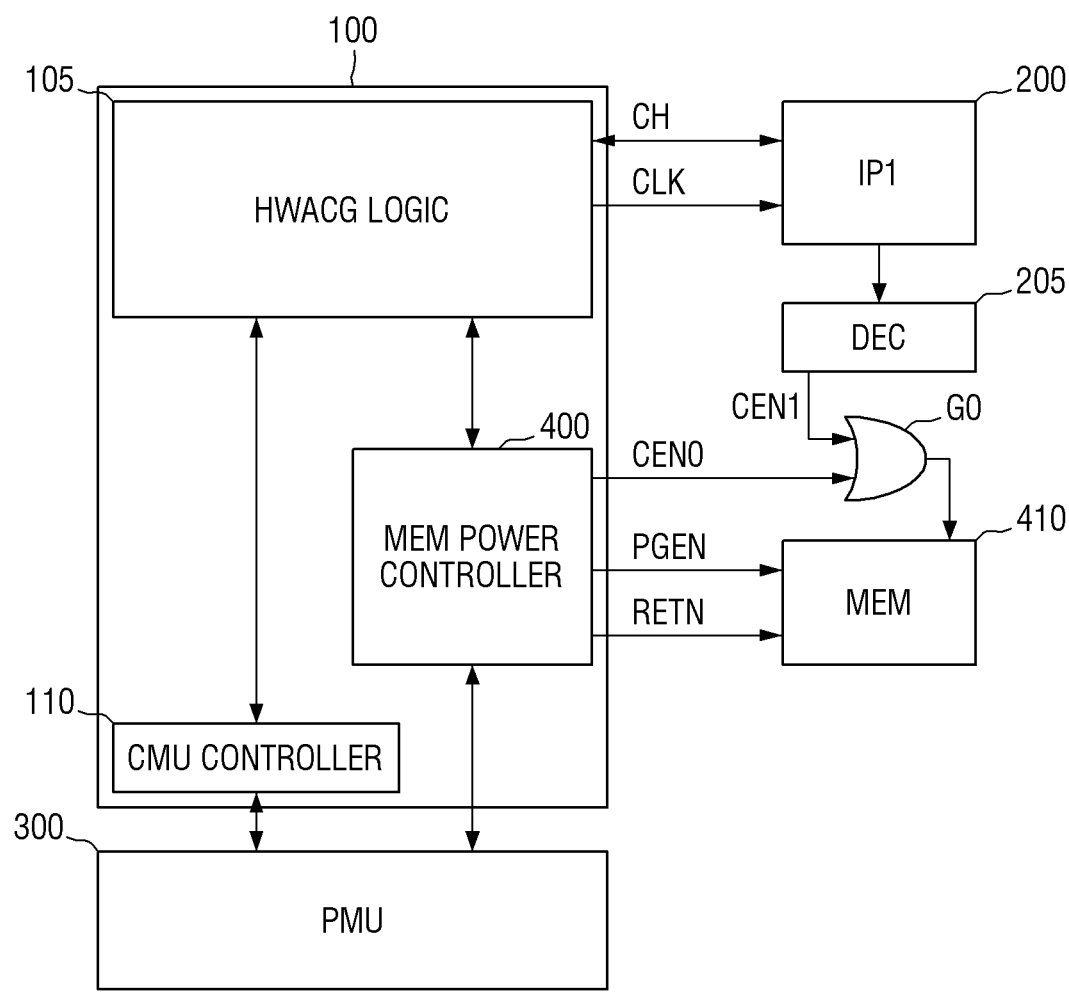
FIG. 2 is a block diagram illustrating a semiconductor device according to an example embodiment.

FIG. 2 is a block diagram illustrating a semiconductor device according to an example embodiment.

Referring to FIG. 2, a semiconductor device 2 according to an example embodiment may include a HWACG logic 105 and a memory power controller 400.

The HWACG logic 105, as described above with reference to FIG. 1, may include the clock components 120*a*, 120*b*, 120*c*, 120*d*, 120*e*, 120*f*, 120*g* and the channel management circuits 130 and 132, and may perform clock gating of the IP block 200 using these elements.

The memory power controller 400 performs power gating of a memory 410 electrically connected to the IP block 200 when the HWACG logic 105 performs the clock gating of the IP block 200. Specifically, the memory power controller 400 performs power gating of the memory 410 depending on the operation of the clock components 120*a*, 120*b*, 120*c*, 120*d*, 120*e*, 120*f*, 120*g* of the HWACG logic 105.

For example, the memory power controller 400 monitors a clock signal CLK output from the clock source 124*f* of the HWACG logic 105, and performs power gating of the memory 410 when the clock signal CLK output from the clock source 124*f* is gated, thereby reducing the power consumed in the memory 410.

If the clock signal CLK output from the clock source 124*f* is gating, this means that the IP block 200 is in a non-running state such as a sleep state, and furthermore, this means that the memory 410 used by the IP block 200 is also in an unused state. Of course, such a scenario assumes that the memory 410 is used only by the IP block 200. If the IP block 210 in the running state is also using the memory 410, power gating of the memory 410 cannot be performed only by the fact that the IP block 200 is in the non-running state.

Specifically, the memory power controller 400 may provide the memory 410 with a power gating enable signal PGEN for performing power gating of the memory 410.

For example, when the power gating enable signal PGEN has a first logic value (for example, L), power gating of the memory 410 is not performed. Unlike this, when the power gating enable signal PGEN has a second logic value (for example, H), power gating of the memory 410 is performed.

Further, the memory power controller 400 may provide a retention signal RETN for preserving data stored in the memory 410 while performing the power gating of the memory 410 to the memory 410, together with the power gating enable signal PGEN.

For example, when the retention signal RETN has a first logical value (for example, L), a retention operation for the memory 410 is performed. Unlike this, when the retention signal RETN has a second logical value (for example, H), a retention operation for the memory 410 is not performed.

The memory power controller 400 may further output a first chip enable signal CEN0. The address decoder 205 may decode address information provided from the IP block 200 and necessary for an operation related to the memory 410, and may output the decoded address information as a second chip enable signal CEN1. The first chip enable signal CEN0 and the second chip enable signal CEN1 may be provided to a chip enable signal pin of the memory 410 after being subjected to a predetermined logic operation G0.

In some embodiments, the configuration of the first chip enable signal CEN0 and the second chip enable signal CEN1 is merely an example, and may be modified by those skilled in the art within the scope of the disclosure.

Figure 3:
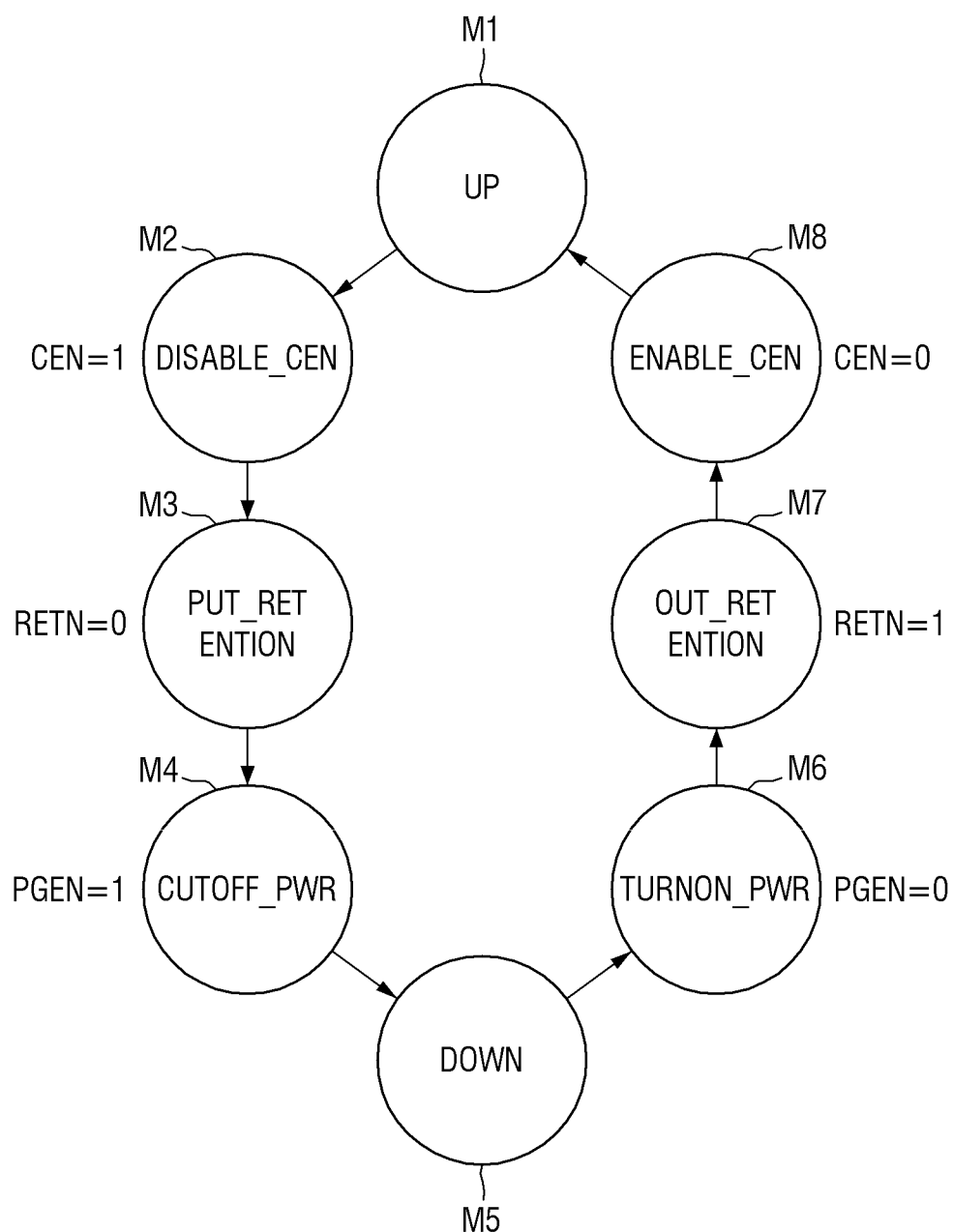
FIG. 3 is a state diagram illustrating the operation of the semiconductor device according to an example embodiment.

FIG. 3 is a state diagram illustrating the operation of the semiconductor device according to an example embodiment.

Referring to FIG. 3, the memory 410 of the semiconductor device 2 according to the example embodiment may have one of a plurality of states M1 to M8 as follows.

The first state M1 means that the memory 410 is in a running state.

The second state M2, which is a state where the chip enable signal CEN has a second logic value (for example, H), means that the memory 410 has been switched to a non-running state. The chip enable signal CEN shown in FIG. 3, as described above with reference to FIG. 2, may be a signal provided to the chip enable signal pin after the first chip enable signal CEN0 and the second chip enable signal CEN1 being subjected to a predetermined logic operation G0.

The third state M3, which is a state where the retention signal RETN has a first logic value (for example, L), means that the retention operation for the memory 410 is performed before the power gating of the memory 410 is performed.

The fourth state M4, which is a state where the power gating enable signal PGEN has a second logic value (for example, H), means that power gating of temporarily turning off the power supplied to the memory 410 starts to be performed.

The fifth state M5 means a state where the power supplied to the memory 410 is blocked and thus the memory 410 is completely turned off.

The sixth state M6, which is a state where the power gating enable signal PGEN has a first logic value (for example, L), means that power gating is completed and a power is supplied to the memory 410.

The seventh state M7, which is a state where the retention signal RETN has a second logic value (for example, H), means that power gating of the memory 410 is completed, the previously stored data is restored, and then the retention operation for the memory 410 is completed.

The eighth state M8, which is a state where the power gating enable signal PGEN has a first logic value (for example, L), means that the memory 410 is switched back to the running state.

Thereafter, the memory is switched to the aforementioned first state M1, and state switching may be repeated depending on the transition of the chip enable signal CEN, the power gating enable signal PGEN and the retention signal RETN.

Figure 4:
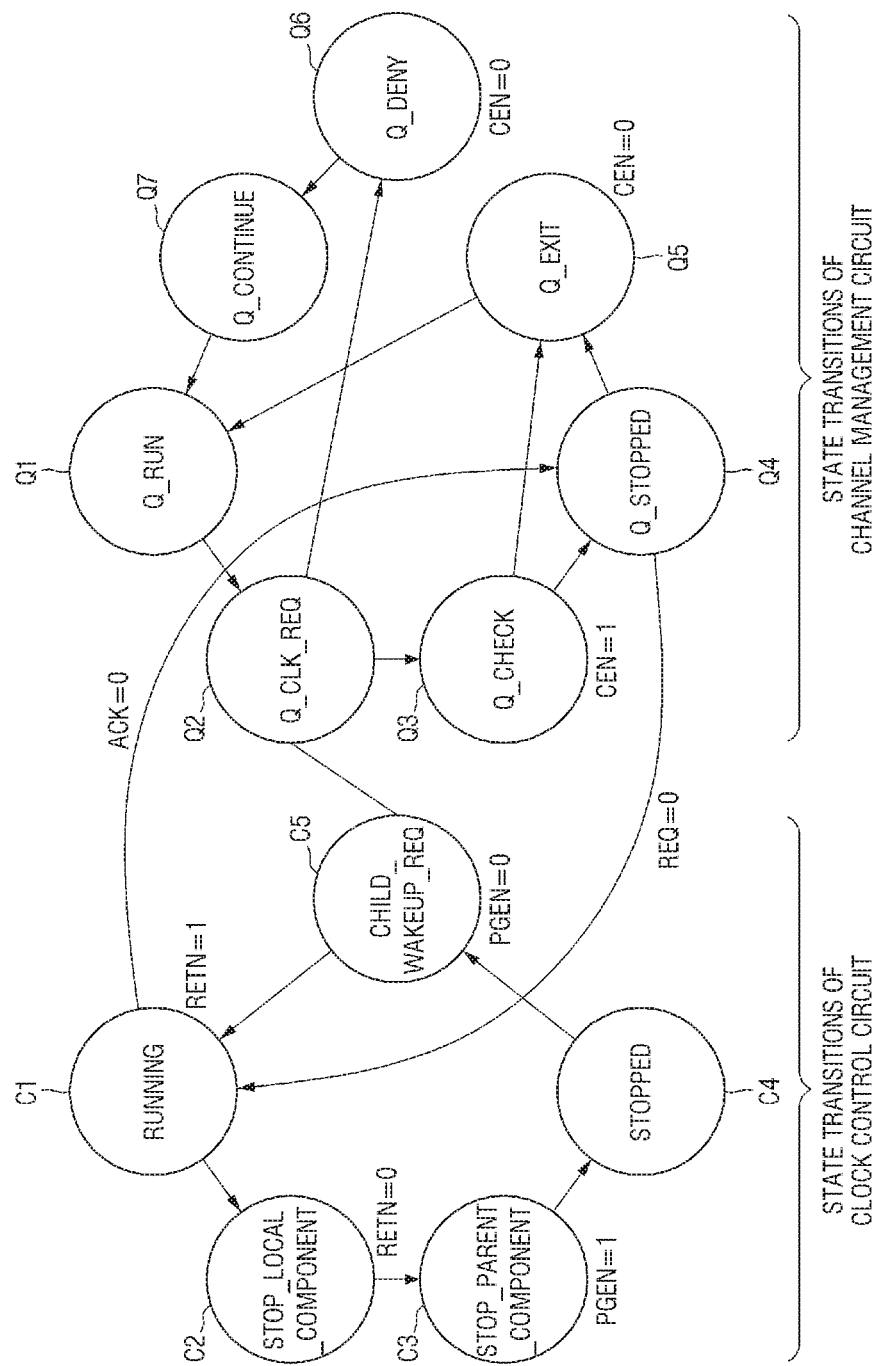
FIG. 4 is a state diagram illustrating the operation of the semiconductor device according to an example embodiment.

FIG. 4 is a state diagram illustrating the operation of the semiconductor device according to an example embodiment.

Referring to FIG. 4, each of the clock control circuits 122a, 122b, 122c, 122d, 122e, 122f, and 122g operating in the HWACG logic 105 of the semiconductor device 2 according to an example embodiment may have any one of a plurality of states C1 to C5 as follows. For convenience, although only the clock control circuit 122e shown to have both a parent and a child in FIG. 1 will be described, the plurality of states C1 to C5 may be equally applied to the other clock control circuits 122a, 122b, 122c, 122d, 122f, and 122g.

The first state C1, which is a state where the clock control circuit 122e is running, means that a clock signal CLK is output from the clock source 124e.

The second state C2, which is a state where the retention signal RETN has a first logic value (for example, L), means that the clock source 124e has stopped the output of the clock signal CLK.

The third state C3, which is a state where the power gating enable signal PGEN has a second logic value (for example, H), means that the clock control circuit 122e has transmitted a clock request REQ having a first logic value ("clock provision stop request") to its parent clock control circuit 122d.

The fourth state C4 means a state where the clock control circuit 122e disables the clock source 124e to stop the provision of the clock signal.

The fifth state C5, which is a state where the power gating enable signal PGEN has a first logic value (for example, L), means that the clock control circuit 122e has received a clock request REQ having a second logic value ("clock provision request") from its child clock control circuit 122f or 122g.

Thereafter, the clock control circuit 122e is switched to the aforementioned first state C1, and state switching may be repeated depending on the full handshake operation of the HWACG logic 105 and the transition of the power gating enable signal PGEN and the retention signal RETN.

The channel management circuit 130 operating in the HWACG logic 105 of the semiconductor device 2 according to an example embodiment may have any one of a plurality of states Q1 to Q7 as follows.

The first state Q1 means a state where the IP block 200 is running.

The second state Q2 means a state where the channel management circuit 130 transmits a quiescence request to the IP block 200.

Since contents of the quiescence request defined between the channel management circuit 130 and the IP block 200 are disclosed in the literature "Low Power Interface Specification" issued by ARM Company, a detailed description thereof will be omitted.

The third state Q3 means a state where the IP block 200 provides a response of accepting the corresponding quiescence request to the channel management circuit 130.

The fourth state Q4 means a state where the IP block 200 accepts the corresponding quiescence request to be switched to an idle state.

The fifth state Q5 means a state where the idle state of the IP block 200 is completed and the IP block 200 wakes up.

Thereafter, the channel management circuit 130 is switched to the aforementioned first state Q1, and state switching may be repeated together with the full handshake operation of the HWACG logic 105.

The sixth state Q6 and the seventh state Q7 indicate a state change when the channel management circuit 130 sends a stop request to the IP block 200 but the IP block 200 rejects the stop request. Since contents thereof are disclosed in the literature "Low Power Interface Specification" issued by ARM Company, a detailed description thereof will be omitted.

Particularly, the first state C1 of the clock control circuit 122f included in the leaf clock component 120f, among the clock control circuits 122a, 122b, 122c, 122d, 122e, 122f, may be switched in the fourth state Q4 of the channel management circuit 130.

Specifically, when the clock request REQ generated in the HWACG logic 105 in the fourth state Q4 of the channel management circuit 130 transitions to the first logic value, the clock control circuit 122f may be switched to the first state C1, and when the acknowledgement ACK generated in the HWACG logic 105 in the first state C1 of the clock control circuit 122f transitions to the first logic value, the channel management circuit 130 may be switched to the fourth state Q4.

Figure 5:
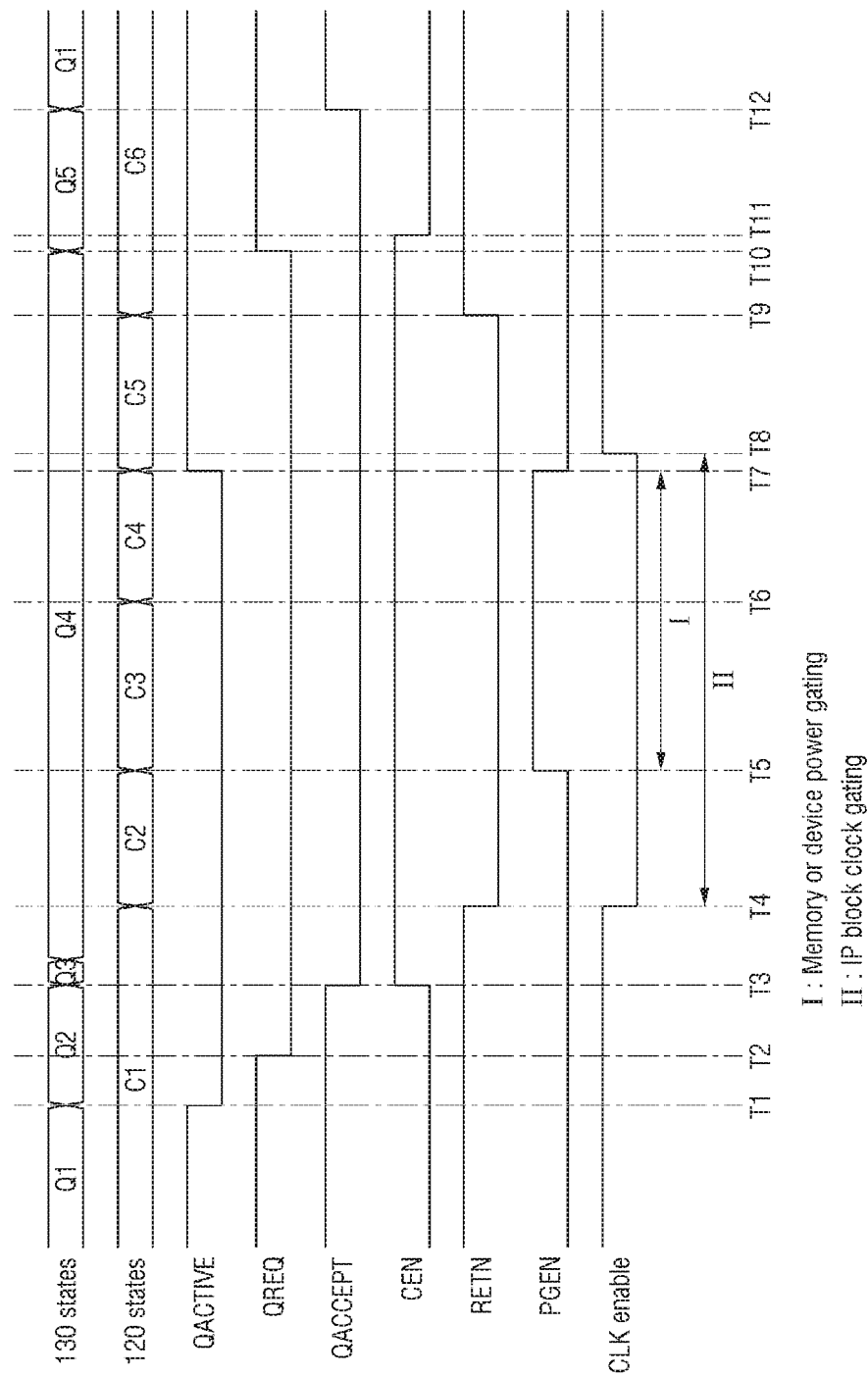
FIG. 5 is a timing chart illustrating the operation of the semiconductor device according to an example embodiment.

FIG. 5 is a timing chart illustrating the operation of the semiconductor device according to an example embodiment.

Referring to FIG. 5, the expression "130 states" indicates a state change of the channel management circuit 130 described above with reference to FIG. 4, and the expression "120 states" indicates a state change of the clock control circuit 122e of the clock component 120e described above with reference to FIG. 4 over time.

In FIG. 5, it is assumed that the communication channel CH provided by the channel management circuit 130 conforms to the Q-channel interface. However, this is merely an example, and the communication channel CH is not limited thereto.

Before the time T1, the clock control circuit 122e operates in a running state, and a clock signal CLK is output from the clock source 124e. That is, the clock control circuit 122e is in the first state C1 described with reference to FIG. 4.

The channel management circuit 130 is also operating in the running state. That is, the channel management circuit 130 is in the first state Q1 described with reference to FIG. 4.

The QACTIVE signal transmitted from the IP block 200 to the channel management circuit 130 has a second logic value (for example, H) for indicating the meaning of having tasks to be processed at present. That is, the IP block 200 is in the running state.

Since the chip enable signal CEN provided to the memory 410 has a first logic value (for example, L), the memory 410 is also in the running state.

At the time T1, the QACTIVE signal transmitted from the IP block 200 to the channel management circuit 130 transitions to the first logic value (for example, L). The QACTIVE signal of the first logical value may indicate that the IP block 200 may accept a quiescence request provided from the channel management circuit 130.

Accordingly, at the time T1, the channel management circuit 130 is switched to the second state Q2 described with reference to FIG. 4.

At the time T2, the QREQn signal transmitted from the channel management circuit 130 to the IP block 200 transitions to the first logic value (for example, L). The QREQn signal of the first logic value may indicate a quiescence request for the IP block 200.

At the time T3, the QACCEPTn signal transmitted from the IP block 200 to the channel management circuit 130 transitions to the first logic value (for example, L). The QACCEPTn signal of the first logical value may indicate a response that the IP block 200 accepts the corresponding quiescence request.

Accordingly, at the time T3, the channel management circuit 130 is switched to the third state Q3 described with reference to FIG. 4. Thereafter, before the time T4 comes, the channel management circuit 130 is again switched to the fourth state Q4 described with reference to FIG. 4.

When the QACCEPTn signal transitions to the first logic value at the time T3, the chip enable signal CEN provided to the memory 410 transitions from the first logic value (for example, L) to the second logic value (for example, H). Accordingly, the memory 410 may be switched to the non-running state. That is, the time T3 may be time at which the memory 410 is switched from the first state M1 to the second state M2 of FIG. 3.

That is, since the IP block 200 enters an idle state at the time T3, the memory 410, which is used only by the IP block 200, is also switched to the non-running state, thereby saving power.

At the time T4, the clock control circuit 122f is switched to the second state C2 described with reference to FIG. 4. That is, since the IP block 200 enters the idle state after the channel management circuit 130 sends and receives signals to/from the IP block 200 through the channel CH before the time T4, the clock source 124f stops the output of the clock signal CLK (refer to "CLK enable" of FIG. 5). The channel management circuit 130 maintains the fourth state Q4 described with reference to FIG. 4.

At the time T4, the retention signal RETN provided to the memory 410 may transition from the second logic value (for example, H) to the first logic value (for example, L). Thus, a retention operation for the memory 410 is performed.

That is, the time T4 may be time at which the memory 410 is switched from the second state M2 to the third state M3 of FIG. 3.

At the time T5, the clock control circuit 122f is switched to the third state C3 described with reference to FIG. 4. That is, for example, the clock control circuit 122f transmits a clock request REQ having the first logic value ("clock provision stop request") to its parent clock control circuit 122e. Thus, the clock source control operation between the parents of the clock control circuit 122e is performed.

At the time T5, the power gating enable signal PGEN provided to the memory 410 may transition from the first logic value (for example, L) to the second logic value (for example, H). Thus, power gating of the memory 410 is performed.

That is, the time T5 may be time at which the memory 410 is switched from the third state M3 to the fourth state M4 of FIG. 3. Thereafter, before the time T7 comes, the memory 410 is again switched to the fifth state M5 described with reference to FIG. 3.

At the time T6, the clock control circuit 122f is switched to the fourth state C4 described with reference FIG. 4. That is, the clock control circuit 122f is in a state of disabling the clock source 124f to stop the provision of the clock signal.

Thereafter, at the time T7, the QACTIVE signal transmitted from the IP block 200 to the channel management circuit 130 transitions to the second logic value (for example, H). That is, the IP block 200 informs the channel management circuit 130 that the IP block 200 is going to wake up through the QACTIVE signal of the second logical value.

Further, the power gating enable signal PGEN provided to the memory 410 may transition from the second logic value (for example, H) to the first logic value (for example, L). Thus, the power gating of the memory 410 is completed.

That is, the time T7 may be time at which the memory 410 is switched from the fifth state M5 to the sixth state M6 of FIG. 3.

Further, the clock control circuit 122f is switched to the fifth state C5 described with reference to FIG. 4. That is, the clock control circuit 122f (receives the "clock provision request" from children if the children exist and) transmits "a clock provision request" to its parents.

Accordingly, at the time T8, for example, the clock source 124f resumes the output of the clock signal CLK (refer to "CLK enable" of FIG. 5).

At the time T9, the clock control circuit 122f is switched to the first state C1 described with reference to FIG. 4. That is, the clock control circuit 122f outputs the clock signal CLK to the IP block 200.

At the time T9, the retention signal RETN provided to the memory 410 may transition from the first logic value (for example, L) to the second logic value (for example, H). Thus, the retention operation for the memory 410 is completed.

That is, the time T9 may be time at which the memory 410 is switched from the sixth state M6 to the seventh state M7 of FIG. 3.

At the time T10, the QREQn signal transmitted from the channel management circuit 130 to the IP block 200 transitions to the second logic value (for example, H). Further, the channel management circuit 130 is switched from the fourth state Q4 described with reference to FIG. 4 to the fifth state Q5 indicating that the IP block 200 wakes up from the idle state.

At the time T11, as the IP block 200 wakes up, the chip enable signal CEN provided to the memory 410 may transition from the second logic value (for example, H) to the first logic value (for example, L). Thus, the memory 410 may be switched to the running state.

That is, the time T11 may be time at which the memory 410 is switched from the seventh state M7 to the eighth state M8 of FIG. 3.

At the time T12, the QACCEPTn signal transmitted from the IP block 200 to the channel management circuit 130 transitions to the second logical value (for example, H), and the channel management circuit 130 is again switched to the first state Q1 of FIG. 4, so that this operation can be repeated.

In summary, while the IP block 200 is idle, the memory 410 is in non-running state because the chip enable signal CEM becomes the second logic value (for example, H) from the time T3 to the time T11, and the retention operation is performed from the time T4 to the time T9 because the retention signal RETN provided to the memory 410 becomes the first logic value (for example, L).

Further, power gating is performed because the power gating enable signal PGEN provided to the memory 410 becomes the second logic value (for example, H) from the time T5 to the time T7.

In this way, the first period I in which power gating of the memory 410 is performed is included in the second period II in which clock gating of the IP block 200 is performed.

As can be seen from the foregoing description with reference to FIGS. 2 to 5, the semiconductor device 2 according to the example embodiment recognizes the time when the HWACG logic 105 operated by hardware performs clock gating of the IP block 200, and thus performs power gating of the memory 410 used by the IP block 200 in hardware at appropriate time, thereby rapidly and precisely reducing the consumption of resources including power.

Figure 6:
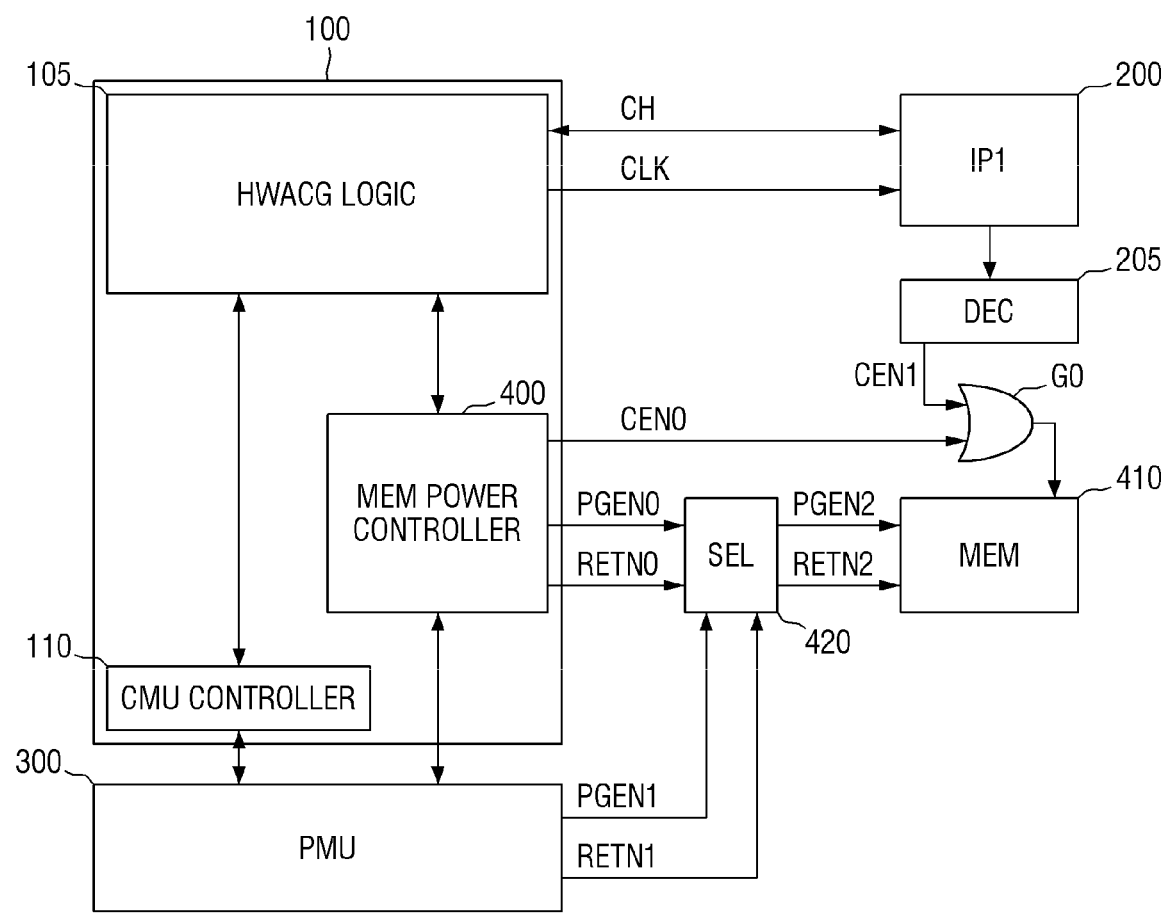
FIG. 6 is a block diagram illustrating a semiconductor device according to another example embodiment.

FIG. 6 is a block diagram illustrating a semiconductor device according to another example embodiment.

Referring to FIG. 6, a semiconductor device 3 according to an example embodiment may include a HWACG logic 105, a memory power controller 400, and a selection circuit 420.

Unlike FIG. 2, the selection circuit 420 disposed between the memory power controller 400 and the memory 410 may receive a first power gating enable signal PGEN0 from the memory power controller 400. The selection circuit 420 may receive a second power gating enable signal PGEN1 from the power management unit (PMU) 300.

Thereafter, the selection circuit 420 provides any one of the first power gating enable signal PGEN0 and the second power gating enable signal PGEN1 to the memory 410 as a third power gating enable signal PGEN2 for performing power gating of the memory 410.

Specifically, when it is required to preserve the data stored in the memory 410 while power gating of the memory 410 is being performed, the selection circuit 420 may provide the first power gating enable signal PGEN0 received from the memory power controller 400 to the memory 410 as the third power gating enable signal PGEN2.

Unlike this, when it is not required to preserve the data stored in the memory 410 while power gating of the memory 410 is being performed, the selection circuit 420 may provide the second power gating enable signal PGEN1 received from the power management unit 300 to the memory 410 as the third power gating enable signal PGEN2. In other words, when it is not required to preserve the data stored in the memory 410, the power management unit 300 may power off the memory 410 directly.

Of course, when it is not required to preserve the data stored in the memory 410 while power gating of the memory 410 is being performed, the selection circuit 420 may provide the second power gating enable signal PGEN1 received from the power management unit 300 to the memory 410 as the third power gating enable signal PGEN2.

According to this embodiment, when it is not required to preserve the data stored in the memory 410, power gating of the memory 410 may be performed more rapidly using the power management unit 300.

Figure 7:
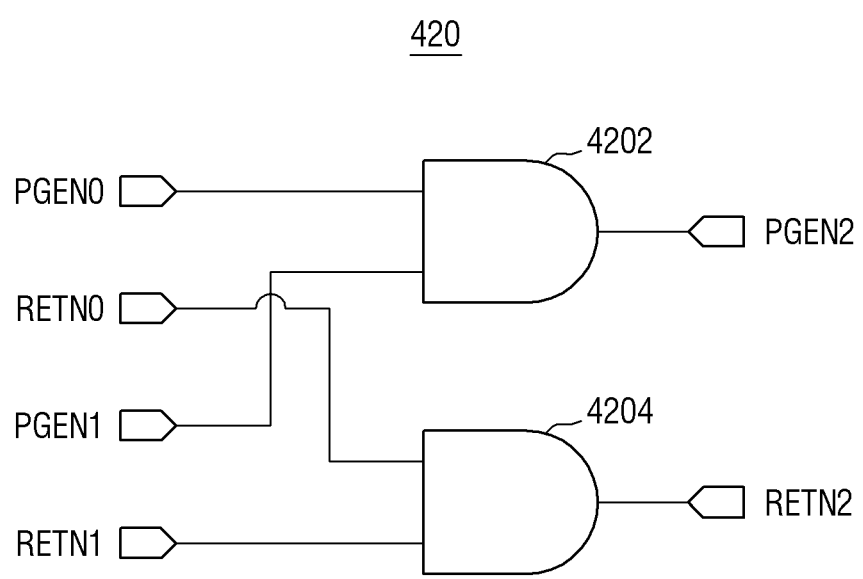
FIG. 7 is a schematic view illustrating an example embodiment of a semiconductor device according to another example embodiment.

FIG. 7 is a schematic view illustrating an example embodiment of a semiconductor device according to another example embodiment.

Referring to FIG. 7, the selection circuit 420 of the semiconductor device 3 according to an example embodiment may include a first isolation cell 4202 and a second isolation cell 4204.

The first isolation cell 4202 receives the first power gating enable signal PGEN0 provided from the memory power controller 400 and the second power gating enable signal PGEN1 provided from the power management unit 300, and outputs any one of them as the third power gating enable signal PGEN2.

The second isolation cell 4204 receives the first retention signal RETN0 provided from the memory power controller 400 and the second retention signal PGEN1 provided from the power management unit 300, and outputs any one of them as the third retention signal RETN2.

For example, when the memory power controller 400 is operating, the memory power controller 400 provides the first power gating enable signal PGEN0 or the first retention signal RETN0 to the memory 410, thereby performing power gating of the memory 410.

Unlike this, when power gating of the power domain included in the memory power controller 400 is performed, the memory power controller 400 can also be powered off, so that the memory 410 cannot be directly controlled. In other words, in this case, the memory power controller 400 cannot provide the first power gating enable signal PGEN0 or the first retention signal RETN0 to the memory 410.

In this case, the power management unit 300 enables the first isolation cell 4202 such that the first isolation cell 4202 outputs the second power gating enable signal PGEN1 as the third power gating enable signal PGEN2. Further, the power management unit 300 enables the second isolation cell 4204 such that the second isolation cell 4204 outputs the second retention signal RETN1 as the third retention signal RETN2.

However, this embodiment is merely an example for implementing the selection circuit 420, and the selection circuit 420 may be varied in its implementation method as needed.

Figure 8:
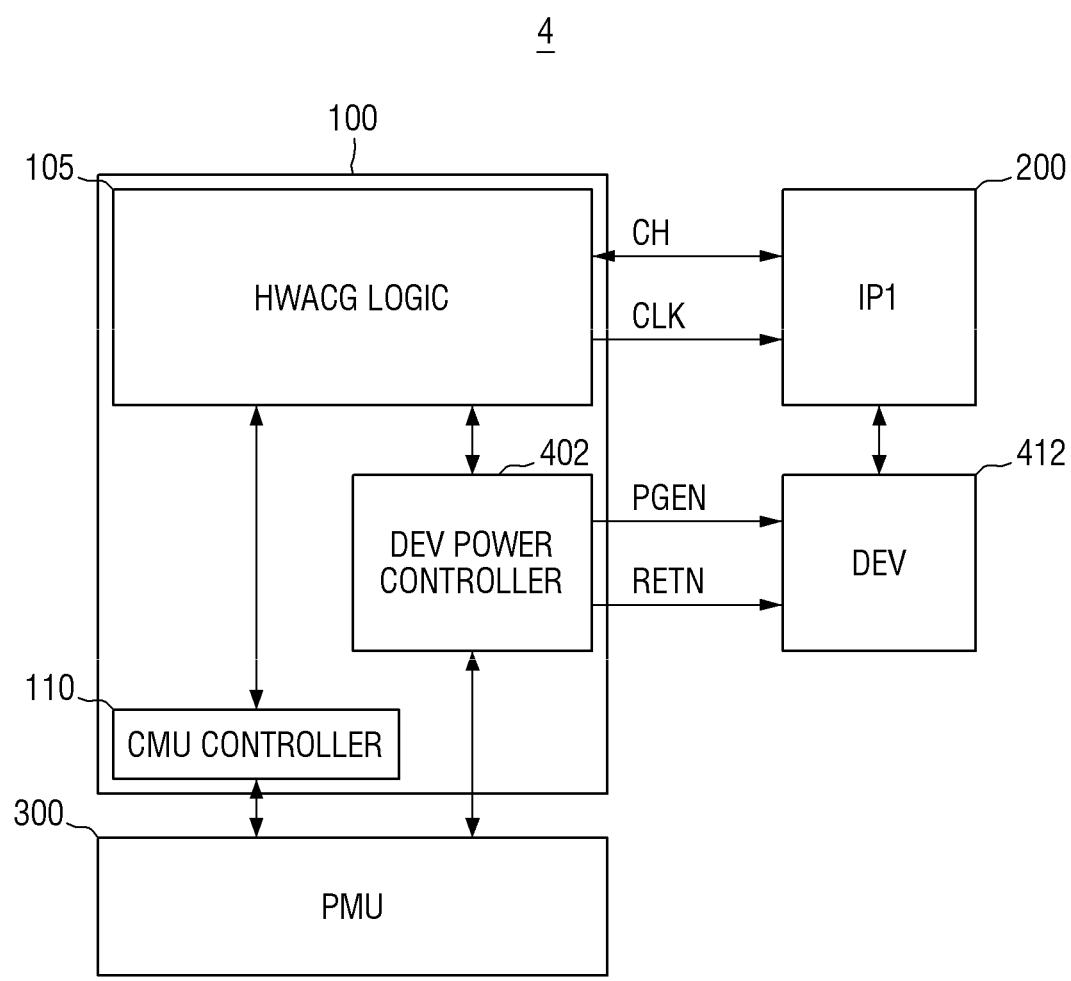
FIG. 8 is a block diagram illustrating a semiconductor device according to another example embodiment.

FIG. 8 is a block diagram illustrating a semiconductor device according to another example embodiment.

Referring to FIG. 8, a semiconductor device 4 according to an example embodiment may include a HWACG logic 105 and a device power controller 402.

The device power controller 402 performs power gating of a device 412 electrically connected to the IP block 200 when the HWACG logic 105 performs clock gating of the IP block 200. Specifically, the device power controller 402 performs power gating of the device 412 depending on the operation of the clock components 120a, 120b, 120c, 120d, 120e, 120f, 120g of the HWACG logic 105.

Here, the device 412 refers to any electrical device that can operate in conjunction with the IP block 200. Particularly, in some example embodiments, the device 412 may refer to any electrical device for which a retention function is supported.

This embodiment differs from the embodiment of FIG. 2 in that an object to be subjected to power gating is not limited to the memory 410, and redundant descriptions will be omitted with respect to substantially the same operation processes.

Figure 9:
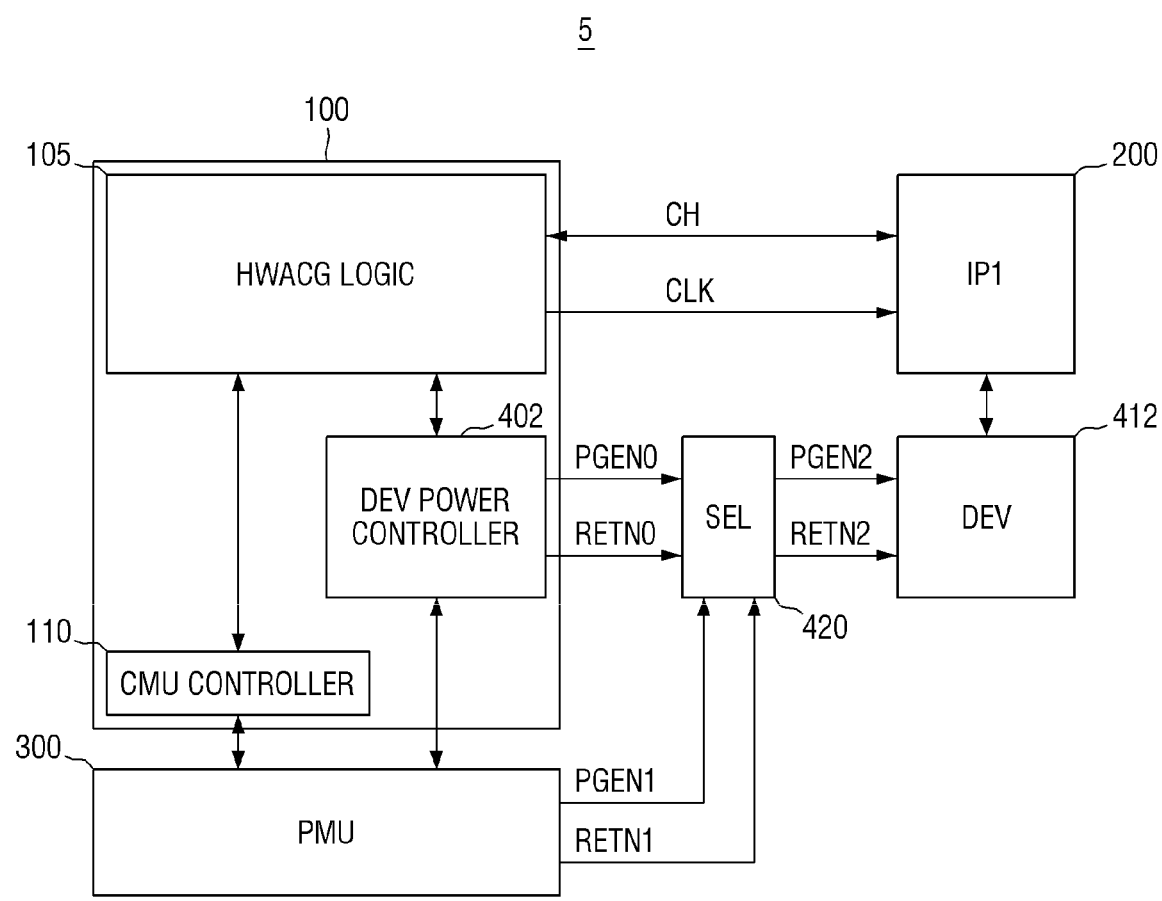
FIG. 9 is a block diagram illustrating a semiconductor device according to another example embodiment.

FIG. 9 is a block diagram illustrating a semiconductor device according to another example embodiment.

Referring to FIG. 9, a semiconductor device 5 according to an example embodiment may include a HWACG logic 105, a device power controller 402, and a selection circuit 420.

Unlike FIG. 8, the selection circuit 420 disposed between the device power controller 402 and a device 412 may receive a first power gating enable signal PGEN0 from the device power controller 402. The selection circuit 420 may receive a second power gating enable signal PGEN1 from the power management unit 300.

Thereafter, the selection circuit 420 any one of the first power gating enable signal PGEN0 and the second power gating enable signal PGEN1 to the device 412 as a third power gating enable signal PGEN2 for performing power gating of the device 412.

Here, the device 412 refers to any electrical device that can operate in conjunction with the IP block 200. Particularly, in some example embodiments, the device 412 may refer to any electrical device for which a retention function is supported.

This embodiment differs from the embodiment of FIG. 6 in that an object to be subjected to power gating is not limited to the memory 410, and redundant descriptions will be omitted with respect to substantially the same operation processes.

Figure 10:
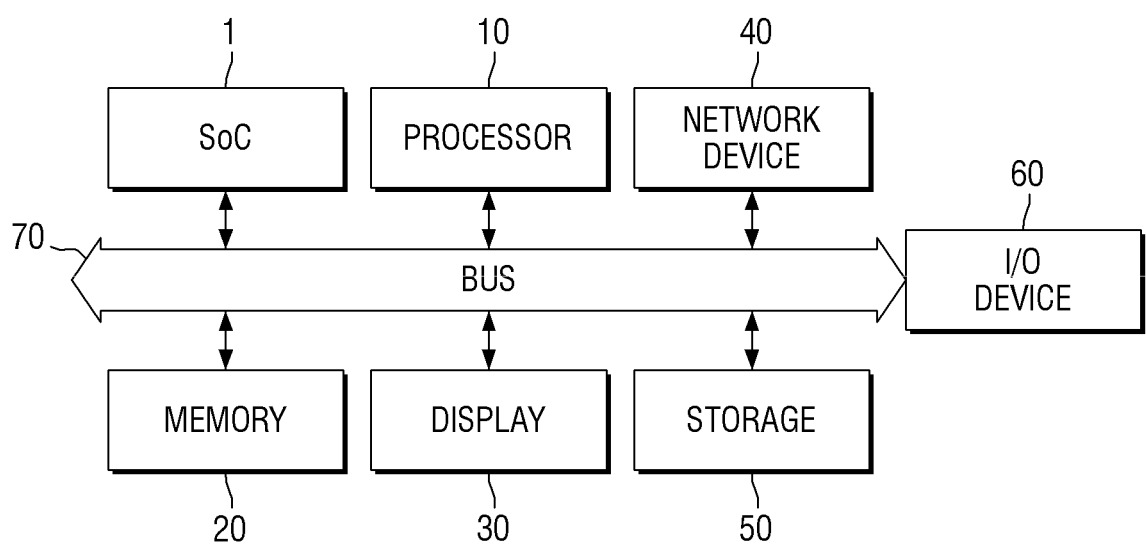
FIG. 10 is a block diagram illustrating a semiconductor system according to an example embodiment.

FIG. 10 is a block diagram illustrating a semiconductor system according to an example embodiment.

Referring to FIG. 10, a semiconductor system according to some example embodiments includes a SoC 1 having aforementioned characteristics, a processor 10, a memory device 20, a display device 30, a network device 40, a storage device 50, and an input/output device 60. The SoC 1, the processor 10, the memory device 20, the display device 30, the network device 40, the storage device 50, and the input/output device 60 may send and receive data to/from each other via a bus 70. Here, the memory device 20 may correspond to the aforementioned memory 410.

The IP blocks in the SoC 1 described according to various example embodiments may include a memory controller for controlling the memory device 20, a display controller for controlling the display device 30, a network controller 40 for controlling the network device 40, a storage controller for controlling the storage device 50, and an input/output controller for controlling the input/output device 60. The semiconductor system may further include an additional processor 10 for controlling these devices.

According to aforementioned various example embodiments, the semiconductor device and the semiconductor system recognize the time when the HWACG logic 105 operated by hardware performs clock gating of the IP block 200, and thus perform power gating of the memory 410 used by the IP block 200 in hardware at appropriate time, thereby rapidly and precisely reducing the consumption of resources including power.

Although example embodiments have been disclosed for illustrative purposes, those skilled in the art will appreciate that various modifications, additions and substitutions are possible, without departing from the scope and spirit of the disclosure as disclosed in the accompanying claims.

What is claimed is:

1. A semiconductor device comprising:
  a hardware auto clock gating (HWACG) logic configured to provide clock gating of an intellectual property (IP) block; and
  a memory power controller configured to perform power gating of a memory electrically connected with the IP block, based on the HWACG logic providing the clock gating for the IP block,
  wherein the HWACG logic comprises:
    a first clock source configured to provide a first clock signal;
    a second clock source configured to receive the first clock signal provided by the first clock source, and provide a second clock signal to the IP block;
    a first clock control circuit configured to control the first clock source; and
    a second clock control circuit configured to transmit a clock request to the first clock control circuit, and control the second clock source, based on an operation state of the IP block.

2. The semiconductor device of claim 1, wherein the HWACG logic is further configured to provide the clock gating of the IP block beginning from a first time and ending at a second time, and
  the memory power controller is further configured to provide, to the memory, a power gating enable signal for performing the power gating beginning from a third time and ending at a fourth time, and the third time occurs after the first time and the fourth time occurs before or at the second time.

3. The semiconductor device of claim 2, wherein the memory power controller is further configured to provide, to the memory before the third time, a retention signal for causing preservation of data stored in the memory.

4. The semiconductor device of claim 1, wherein the memory power controller is further configured to perform the power gating of the memory by setting a first retention signal to an active level followed by setting a chip enable signal to an inactive level followed by setting a power gating enable signal to an active level, and
operational state transitions of the second clock source are based on the power gating enable signal.

5. The semiconductor device of claim 1, further comprising:
a power management unit; and
a selection circuit configured to:
receive a first power gating enable signal from the memory power controller,
receive a second power gating enable signal from the power management unit, and
provide, based on at least one of the first power gating enable signal and the second power gating enable signal, a third power gating enable signal to the memory.

6. The semiconductor device of claim 5, wherein the selection circuit comprises a first isolation cell and a second isolation cell,
the first isolation cell is coupled to the memory power controller, to the power management unit, and to the memory,
the first isolation cell is configured to provide the third power gating enable signal to the memory,
the second isolation cell is coupled to the memory power controller, to the power management unit, and to the memory, and
the second isolation cell is configured to provide a second retention signal to the memory.

7. The semiconductor device of claim 6, wherein the power management unit is configured to provide a third retention signal to the second isolation cell at a time when the memory power controller is powered off.

8. A semiconductor device comprising:
a hardware auto clock gating (HWACG) logic configured to provide clock gating of an intellectual property (IP) block; and
a device power controller configured to perform power gating of a device electrically connected with the IP block based on the HWACG logic providing the clock gating of the IP block,
wherein the HWACG logic comprises:
a first clock source configured to provide a first clock signal;
a second clock source configured to receive the first clock signal provided by the first clock source, and provide a second clock signal to the IP block;
a first clock control circuit configured to control the first clock source; and
a second clock control circuit configured to transmit a clock request to the first clock control circuit, and control the second clock source, based on an operation state of the IP block.

9. The semiconductor device of claim 8, wherein the HWACG logic is further configured to provide the clock gating of the IP block beginning from a first time and ending at a second time, and the device power controller is further configured to provide, to the device, a power gating enable signal for performing the power gating beginning from a third time and ending at a fourth time, and the third time occurs after the first time and the fourth time occurs before or at the second time.

10. The semiconductor device of claim 9, wherein the device power controller is further configured to provide, to the device before the third time, a retention signal for performing a retention operation for the device.

11. The semiconductor device of claim 8, further comprising:
a power management unit; and
a selection circuit configured to:
receive a first power gating enable signal from the device power controller,
receive a second power gating enable signal from the power management unit, and
provide, based on at least one of the first power gating enable signal and the second power gating enable signal, as a third power gating enable signal to the device.

12. The semiconductor device of claim 11, wherein the selection circuit comprises a first isolation cell and a second isolation cell,
the first isolation cell is coupled to the device power controller, to the power management unit, and to the device,
the first isolation cell is configured to provide the third power gating enable signal to the device,
the second isolation cell is coupled to the device power controller, to the power management unit, and to the device, and
the second isolation cell is configured to provide a second retention signal to the device.

13. The semiconductor device of claim 12, wherein the power management unit is configured to provide a third retention signal to the second isolation cell at a time when the device power controller is powered off.

14. A semiconductor system comprising:
a system-on-chip (SoC) comprising:
an intellectual property (IP) block, and
a clock management unit (CMU) configured to provide a clock signal to the IP block; and
at least one external device electrically connected with the SoC,
wherein the clock management unit (CMU) comprises:
a hardware auto clock gating (HWACG) logic configured to provide clock gating of the IP block, and
a memory power controller configured to perform power gating of a memory electrically connected with the IP block, based on the HWACG logic providing the clock gating for the IP block,
wherein the HWACG logic comprises:
a first clock source configured to provide a first clock signal;
a second clock source configured to receive the first clock signal provided by the first clock source, and provide a second clock signal to the IP block;
a first clock control circuit configured to control the first clock source; and
a second clock control circuit configured to transmit a clock request to the first clock control circuit and control the second clock source, based on an operation state of the IP block.

15. The semiconductor system of claim 14, wherein the HWACG logic is further configured to provide the clock gating of the IP block beginning from a first time and ending at a second time, and the memory power controller is further configured to provide, to the memory, a power gating enable signal for performing the power gating beginning from a third time and ending at a fourth time, and the third time occurs after the first time and the fourth time occurs before or at the second time.

16. The semiconductor system of claim 15, wherein the memory power controller is further configured to provide, to the memory before the third time, a retention signal for causing preservation of data stored in the memory.

17. The semiconductor system of claim 14, wherein the memory power controller is further configured to perform the power gating of the memory by setting a first retention signal to an active level followed by setting a chip enable signal to an inactive level followed by setting a power gating enable signal to an active level, and operational state transitions of the second clock source are based on the power gating enable signal.

18. The semiconductor system of claim 14, further comprising:

a power management unit; and a selection circuit configured to:

receive a first power gating enable signal from the memory power controller, receive a second power gating enable signal from the power management unit, and provide, based on at least one of the first power gating enable signal and the second power gating enable signal, a third power gating enable signal to the memory.

19. The semiconductor system of claim 18, wherein the selection circuit comprises a first isolation cell and a second isolation cell, the first isolation cell is coupled to the memory power controller, to the power management unit, and to the memory, the first isolation cell is further configured to provide the third power gating enable signal to the memory, the second isolation cell is coupled to the memory power controller, to the power management unit, and to the memory, and the second isolation cell is further configured to provide a second retention signal to the memory.

20. The semiconductor system of claim 19, wherein the power management unit is configured to provide a third retention signal to the second isolation cell at a time when the memory power controller is powered off.

* * * * *